(12) United States Patent  
Gouchi et al.

(10) Patent No.: US 9,013,882 B2  
(45) Date of Patent: Apr. 21, 2015

(54) HIGH-FREQUENCY MODULE

(71) Applicant: Murata Manufacturing Co., Ltd., Kyoto (JP)

(72) Inventors: Naoki Gouchi, Kyoto (JP); Takahiro Baba, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/328,989

(22) Filed: Jul. 11, 2014

(65) Prior Publication Data

US 2014/0321069 A1 Oct. 30, 2014

Related U.S. Application Data

(63) Continuation of application No. PCT/JP2013/061164, filed on Apr. 15, 2013.

(30) Foreign Application Priority Data

Jun. 14, 2012 (JP) .................................. 2012-134739

(51) Int. Cl.
*H05K 7/00* (2006.01)
*H05K 1/18* (2006.01)
(Continued)

(52) U.S. Cl.
CPC .......... *H05K 1/185* (2013.01); *H01L 23/49827* (2013.01); *H01L 23/49838* (2013.01); *H01L 21/4857* (2013.01); *H01L 23/5389* (2013.01); *H01L 23/66* (2013.01); *H05K 1/16* (2013.01); *H05K 3/4632* (2013.01); *H05K 3/4697* (2013.01); *H01L 23/562* (2013.01); *H01L 23/585* (2013.01); *H01L 25/165* (2013.01);
(Continued)

(58) Field of Classification Search
USPC .......... 361/728, 761, 764–766; 174/255, 257, 174/258, 260, 262; 257/659, 693, 702; 29/829, 830, 832, 837; 428/209; 438/106, 127
See application file for complete search history.

(56) References Cited

U.S. PATENT DOCUMENTS 6,492,203 B1 * 12/2002 Wakashima et al. .......... 438/127
6,617,193 B1 * 9/2003 Toshio et al. .................. 438/106
(Continued)

FOREIGN PATENT DOCUMENTS

JP 11-045955 A 2/1999
JP 2002-270712 A 9/2002
(Continued)

OTHER PUBLICATIONS

International Search Report issued in Application No. PCT/JP2013/061164, (May 14, 2013).
(Continued)

*Primary Examiner* — Xiaoliang Chen
(74) *Attorney, Agent, or Firm* — Pearne & Gordon LLP (57) ABSTRACT

A high-frequency module has a multilayer board formed by laminating a plurality of sheets made of a thermoplastic resin material and subjecting the laminated sheets to thermocompression bonding, and an IC chip placed in a cavity provided in the multilayer board. A gap is provided between a side of the IC chip and an inner wall of the cavity. The multilayer board includes a via-hole conductor provided near the inner wall of the cavity for preventing the resin sheets from being softened and flowing into the cavity upon thermocompression bonding.

14 Claims, 5 Drawing Sheets

(51) Int. Cl.
*H01L 23/538* (2006.01)
*H01L 23/66* (2006.01)
*H05K 1/16* (2006.01)
*H01L 23/58* (2006.01)
*H01L 25/16* (2006.01)
*H05K 1/11* (2006.01)
*H01L 23/498* (2006.01)
*H01L 21/48* (2006.01)
*H05K 3/46* (2006.01)
*H01L 23/00* (2006.01)

(52) U.S. Cl.
CPC ....... H01L 24/19 (2013.01); *H01L 2224/16225* (2013.01); *H01L 2924/19105* (2013.01); H05K 1/115 (2013.01); *H05K 2201/032* (2013.01); *H05K 2201/042* (2013.01); H01L 23/49822 (2013.01); H01L 23/49894 (2013.01)

(56) References Cited

U.S. PATENT DOCUMENTS

| | | | | |
|---|---|---|---|---|
| 8,331,102 | B2* | 12/2012 | Inagaki et al. | 361/765 |
| 2002/0185303 | A1* | 12/2002 | Takeuchi et al. | 174/256 |
| 2002/0192442 | A1* | 12/2002 | Kondo et al. | 428/209 |
| 2004/0091687 | A1* | 5/2004 | Kondo et al. | 428/209 |
| 2006/0042078 | A1* | 3/2006 | Takeuchi et al. | 29/830 |
| 2006/0191711 | A1* | 8/2006 | Cho et al. | 174/260 |
| 2007/0095471 | A1* | 5/2007 | Ito et al. | 156/293 |
| 2008/0007927 | A1* | 1/2008 | Ito et al. | 361/764 |
| 2008/0049405 | A1* | 2/2008 | Sahara et al. | 361/761 |
| 2008/0211086 | A1* | 9/2008 | Morita | 257/702 |
| 2009/0188703 | A1* | 7/2009 | Ito et al. | 174/255 |
| 2009/0230541 | A1* | 9/2009 | Araki et al. | 257/693 |
| 2009/0316373 | A1* | 12/2009 | Kim et al. | 361/764 |
| 2010/0159647 | A1* | 6/2010 | Ito et al. | 438/124 |
| 2011/0176284 | A1* | 7/2011 | Ito et al. | 361/762 |
| 2011/0193203 | A1* | 8/2011 | Goto et al. | 257/659 |
| 2011/0225816 | A1* | 9/2011 | Chou et al. | 29/829 |
| 2011/0244636 | A1* | 10/2011 | Kondo | 438/127 |
| 2011/0314668 | A1* | 12/2011 | Ito et al. | 29/837 |
| 2012/0006587 | A1* | 1/2012 | Ito et al. | 174/257 |
| 2012/0077317 | A1* | 3/2012 | Ito et al. | 438/124 |
| 2012/0106108 | A1* | 5/2012 | Ito et al. | 361/761 |
| 2012/0188734 | A1* | 7/2012 | Mikado et al. | 361/761 |

FOREIGN PATENT DOCUMENTS

| | | |
|---|---|---|
| JP | 2003-078250 A | 3/2003 |
| JP | 2005-317585 A | 11/2005 |
| JP | 2007-287844 A | 11/2007 |
| WO | 2009/093343 A1 | 7/2009 |
| WO | 2011/114766 A1 | 9/2011 |

OTHER PUBLICATIONS

Written Opinion issued in Application No. PCT/JP2013/061164, (May 14, 2013).

* cited by examiner

HIGH-FREQUENCY MODULE

This application is based on Japanese Patent Application No. 2012-134739 filed on Jun. 14, 2012 and International Application No. PCT/JP2013/061164 filed on Apr. 15, 2013, the content of each of which is incorporated herein by reference.

BACKGROUND OF THE INVENTION

1. Field of the Invention

The present invention relates to high-frequency modules, particularly to a high-frequency module mounted as a communication device in electronic equipment such as a mobile communication terminal.

2. Description of Related Art

In recent years, electronic equipment such as mobile communication terminals is required to have advanced functionality and a compact size, and electronic components to be mounted therein are demanded to meet such requirements as well. Therefore, a high-frequency module with various high-frequency components integrated on one board is used as this type of electronic component.

To achieve further advanced functionality and a more compact size, in some cases, a module with an IC chip provided in a multilayer board made of thermoplastic resin is used. In a multilayer resin board with an internal IC chip, the IC chip is embedded in a cavity provided by laminating resin sheets with openings made by punching or suchlike, as described in Japanese Patent Laid-Open Publication Nos. 2002-270712 and 2005-317585.

However, in the case of such a conventional module with an internal IC chip, the resin is softened and fluidized upon thermocompression bonding of the laminate of resin sheets, so that the walls of the cavity are hardened by being pressed against the sides of the IC chip. That is, in a complete module, the sides of the IC chip contact the hardened resin or are pressed against the hardened resin within the cavity. Therefore, in the case where the multilayer board was subjected to a mechanical impact due to a fall or collision, or in the case where the walls of the cavity were deformed by thermal stress, the IC chip, which is made of silicon, might be damaged, e.g., cracked, or moved out of position, resulting in a failure.

SUMMARY OF THE INVENTION

A high-frequency module according to an embodiment of the present invention includes a multilayer board formed by laminating a plurality of sheets made of a thermoplastic resin material and subjecting the laminated sheets to thermocompression bonding, and an IC chip placed in a cavity provided in the multilayer board. A gap is provided between a side of the IC chip and an inner wall of the cavity. The multilayer board includes a via-hole conductor provided near the inner wall of the cavity for preventing the resin sheets from being softened and flowing into the cavity upon thermocompression bonding.

DETAILED DESCRIPTION OF THE PREFERRED EMBODIMENTS

Hereinafter, examples of a high-frequency module according to the present invention will be described with reference to the accompanying drawings. Note that in the figures, common elements and portions will be denoted by the same reference numerals and characters, and any overlapping descriptions will be omitted.

Figure 1A:
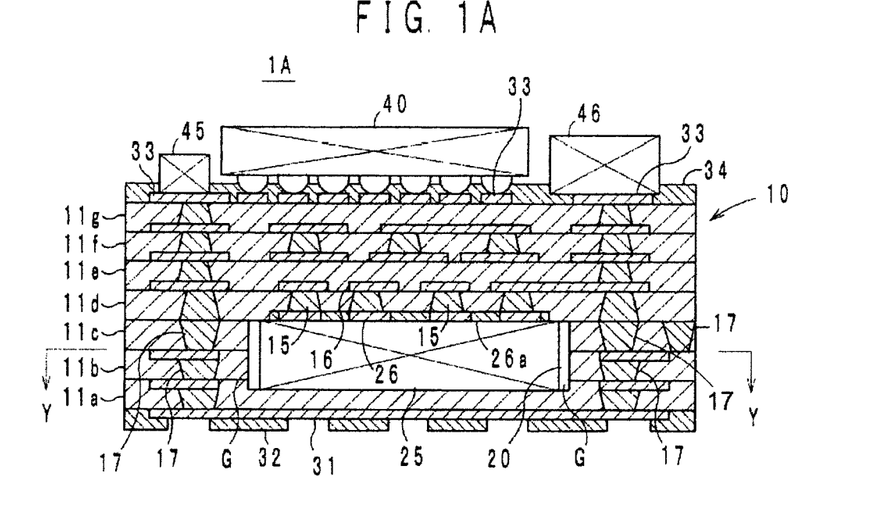
FIG. 1A is a vertical cross-sectional view of a high-frequency module of a first example along line X-X of FIG. 1B.
Figure 1B:
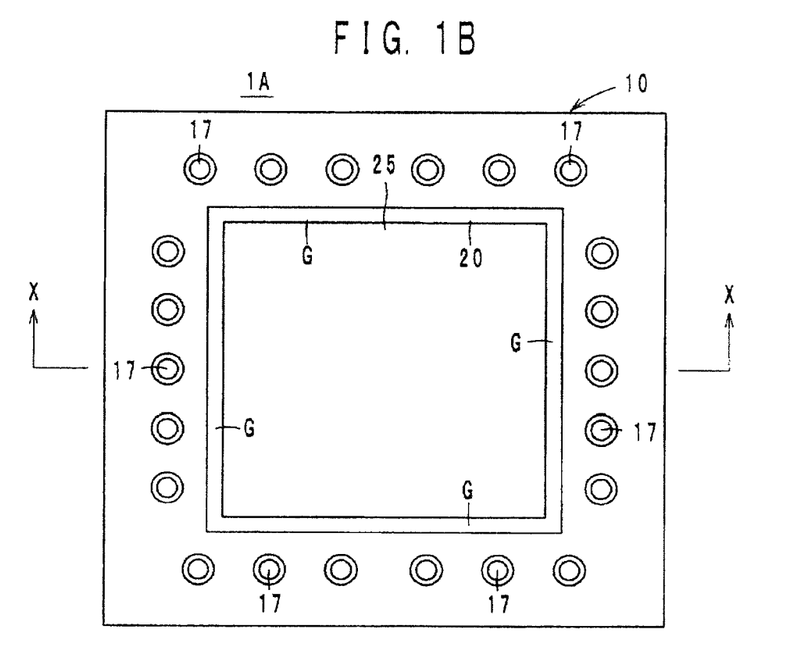
FIG. 1B is a horizontal cross-sectional view of the high-frequency module of the first example along line Y-Y of FIG. 1A.

First Example with Reference to FIGS. 1A and 1B

In a high-frequency module 1A of a first example, a memory IC chip 25 is provided in a cavity 20 made within a multilayer board 10, as shown in FIGS. 1A and 1B. The multilayer board 10 has provided on the bottom surface a conductor pattern 31 partially coated with a solder resist 32, and by the conductor pattern 31, the multilayer board 10 is mounted on a motherboard of unillustrated electronic equipment such as a mobile communication terminal. The multilayer board 10 has electronic components in the form of chips, such as a wireless communication IC 40, a capacitor 45, and an inductor 46, mounted on a conductor pattern 33 positioned on the top surface and partially coated with a solder resist 34.

The wireless communication IC 40 is, for example, an RFIC chip for handling a high-frequency signal. The capacitor 45 is used for forming an impedance matching circuit for the wireless communication IC 40. The inductor 46 is used for forming a filter circuit. The memory IC chip 25 provided in the multilayer board 10 is a memory device having an encryption function and acting as a secure element IC, and includes an integrated circuit provided on its semiconductor substrate and connected through a rewiring layer 26 to a conductor pattern 16 through via-hole conductors 15.

Furthermore, various conductor patterns and via-hole conductors in the multilayer board 10 constitute necessary circuits. The memory IC chip 25 is electrically connected to the wireless communication IC 40 via these internal circuits. Moreover, the rewiring layer 26 is provided with lands 26a directly connected to end surfaces of the via-hole conductors 15.

The multilayer board 10 includes a plurality of sheets 11a to 11g made of a thermoplastic resin material and subjected to thermocompression bonding after lamination, in which a cavity 20 is made in the multilayer board 10 by laminating the sheets 11b and 11c, which have openings made by punching, along with the other sheets 11a and 11d to 11g. Moreover, the sheets 11a to 11g are provided with the via-hole conductors and necessary conductor patterns, and therefore, passive elements, such as lines and capacitors, are formed by laminating the sheets 11a to 11g. A preferable example of the resin material used is a thermoplastic resin material such as polyimide resin or liquid crystal polymer. Liquid crystal polymer is a particularly preferable material because of its superior high-frequency characteristics and low water absorption rate. The conductor patterns and the via-hole conductors are preferably made of metal materials mainly composed of silver or copper and having low specific resistances. Moreover, epoxy resin, silicon resin, or the like can be used for the solder resists 32 and 34.

The cavity 20 is rectangular, which is the same as the memory IC chip 25 as viewed in a plan view, and the cavity 20 has a volume such that, when the memory IC chip 25 is placed therein, there is a gap G of from about 10 micrometers [μm] to about 300 μm (preferably, about 100 μm) to each of the four sides of the chip 25. Moreover, in order to prevent resin sheets adjacent to the inner walls of the cavity 20 (in particular, the sheets 11b and 11c) from being softened and fluidized and flowing into the cavity upon thermocompression bonding of the resin sheets, via-hole conductors 17 (referred to below as fluidization preventing via-hole conductors), which are examples of a first and a second via-hole conductors, are arranged around the entire periphery of the cavity 20 more specifically, in a line at intervals of, for example, 1 mm along each side of the cavity 20. The via-hole conductor 17 has a diameter of, for example, from 50 μm to 300 μm.

The material of the resin sheets 11a to 11g is softened at about 250° C. to about 300° C., and the resin sheets 11a to 11g are heated up to such a temperature range upon thermocompression bonding. On the other hand, the material of the fluidization preventing via-hole conductors 17 is solidified at lower temperatures. For example, the fluidization preventing via-hole conductors 17 are made of solder or a metal alloy mainly composed of silver or copper; for a simplified production process, it is preferable to use the same material as the other via-hole conductors.

Normally, in the case where there are no fluidization preventing via-hole conductors 17, upon thermocompression bonding after the lamination of the resin sheets, the inner wall portions of the resin sheets 11b and 11c are softened and fluidized and flow into the cavity 20, and then, the fluidized product is hardened in a state where it is in contact or tight contact with almost the entire sides of the memory IC chip 25. However, in the first example, since the via-hole conductors 17 are arranged in the vicinity of the inner walls of the cavity 20, the gap G is maintained approximately in the same state even after thermocompression bonding of the resin sheets. Therefore, after a high-frequency module is complete, even if the multilayer board 10 is subjected to a mechanical impact due to a fall or collision, or thermal stress occurs in the multilayer board 10, the inner walls of the cavity 20 are not deformed significantly, so that the memory IC chip 25 can be inhibited from being damaged, e.g., cracked, or moved out of position, whereby the occurrence of a failure can be prevented.

Furthermore, the memory IC chip 25 is inhibited from being displaced when being pressed upon thermocompression bonding. In addition, the presence of the gap G increases the degree of electrical and thermal isolation between the memory IC chip 25 and the multilayer board 10, thereby improving the electrical characteristics and the reliability of the high-frequency module.

Note that the top and bottom surfaces of the memory IC chip 25 may or may not be bonded with resin sheets 11a and 11d under pressure, and even if not, the position of the memory IC chip 25 is fixed within the cavity 20 by connecting the lands 26a and the via-hole conductors 15.

The fluidization preventing via-hole conductors 17 may form an electrical path, i.e., they may be electrically connected to passive elements, such as ground conductors and capacitors, via a conductor pattern formed on a given resin sheet. Moreover, in the case where such an electrical path is not formed, all or at least one of the fluidization preventing via-hole conductors 17 (shown schematically in FIG. 1A) may be electrically insulated.

Furthermore, the fluidization preventing via-hole conductors 17 do not have to be arranged around the entire periphery of the cavity 20. Even if there is a possibility that the resin sheets might be fluidized around some of the four inner wall portions, the via-hole conductors 17 can be omitted from where such fluidization is tolerable, so long as the sides of the memory IC chip 25 are not pressed firmly. However, the sides of the memory IC chip 25 might be pressed firmly around corners, which are diagonally positioned when viewed in a plan view, and therefore, it is preferable that the fluidization preventing via-hole conductors 17 be arranged around the four corners. Accordingly, the fluidization preventing via-hole conductors 17 are not necessarily arranged at equal intervals near the four inner wall portions.

Figure 2A:
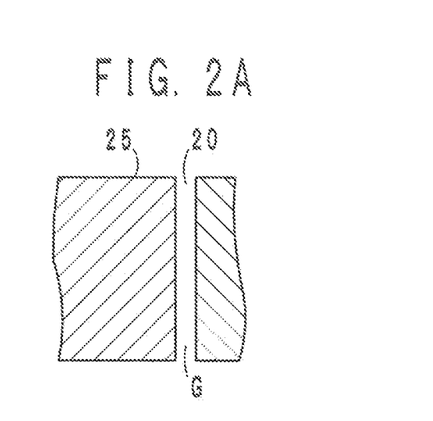
FIGS. 2A, 2B, and 2C are cross-sectional diagrams illustrating various forms of a gap provided between an IC chip and a cavity in the high-frequency module.
Figure 2B:
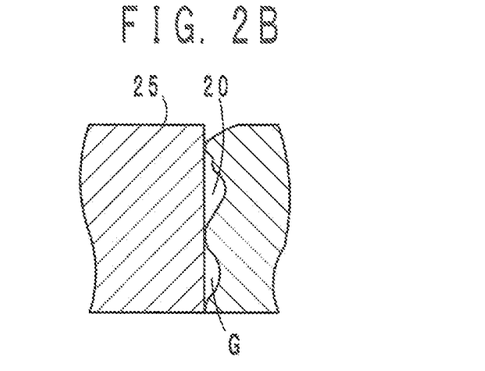
Figure 2C:
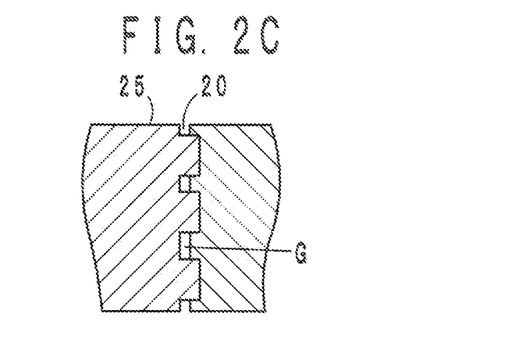

The gap G is provided as a complete gap between the side of the memory IC chip 25 and the wall of the cavity 20, so that there is no contact between the side and the wall, as shown in FIG. 2A, but this is not limiting. The wall of the cavity 20 may have irregular protrusions and depressions, so that the protrusions partially contact the side of the memory IC chip 25, as shown in FIG. 2B. Alternatively, in the case where the side of the memory IC chip 25 has protrusions and depressions, the wall of the cavity 20 may be shaped so as to have corresponding protrusions and depressions to be engaged with the side of the memory IC chip 25 with gaps G being provided therebetween.

Figure 3:
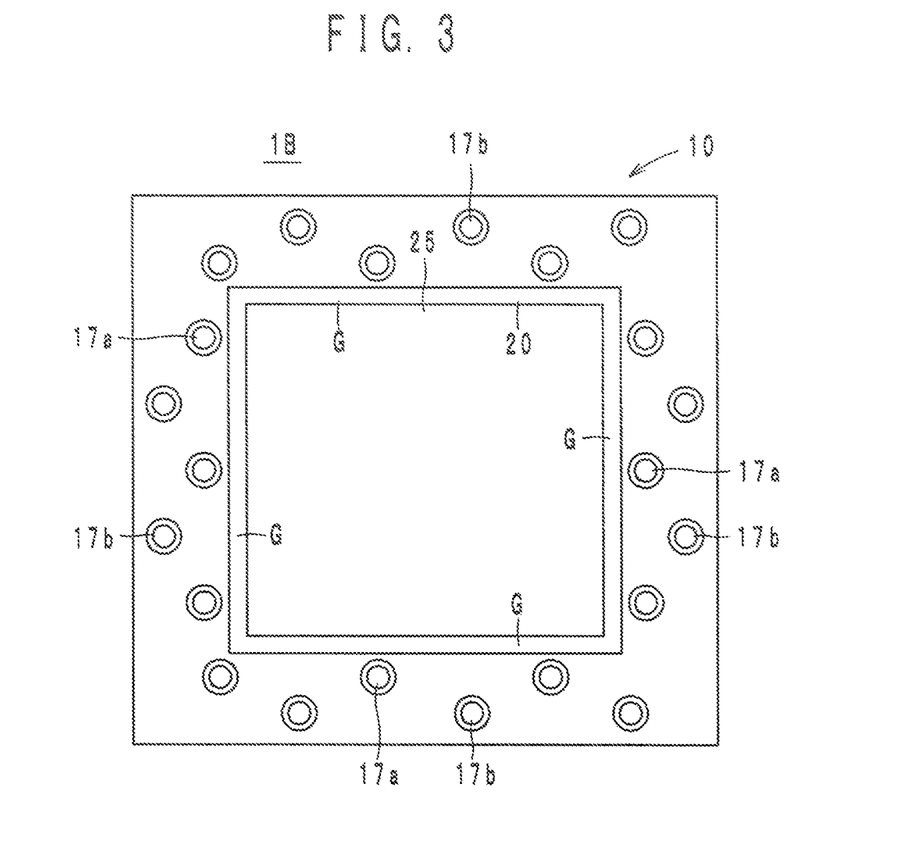
FIG. 3 is a plan view of a high-frequency module of a second example corresponding to a plane along line Y-Y of FIG. 1A.

Second Example with Reference to FIG. 3

In a high-frequency module 1B of a second example, fluidization preventing via-hole conductors 17a and 17b are arranged in a zigzag manner near the four inner walls of the cavity 20 when viewed in a plan view, as shown in FIG. 3. The fluidization preventing via-hole conductors 17a, which are located inside, are provided in the resin sheet 11b (see FIG. 1A), and the fluidization preventing via-hole conductors 17b, which are located outside, are provided in the resin sheet 11c. In the second example, other features are the same as in the first example, and achieve the same effects as in the first example.

Incidentally, in the case where the fluidization preventing via-hole conductors 17 are arranged so as to overlap with each other in the direction of lamination of the multilayer board 10, the multilayer board 10 becomes thicker at such overlapping portions (where the via-hole conductors are positioned) because the via-hole conductors do not shrink as much as the resin sheets upon thermocompression bonding, so that the flatness of the multilayer board 10 might be impaired. However, in the second example, the fluidization preventing via-hole conductors 17a and 17b are arranged in a zigzag manner, such partial unevenness in the thickness of the multilayer board 10 can be eliminated.

Figure 4:
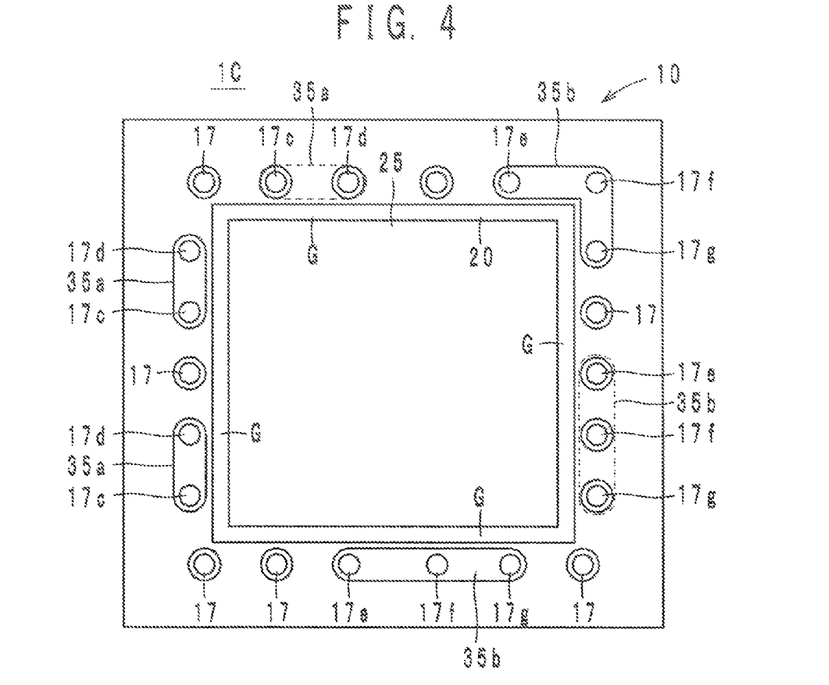
FIG. 4 is a plan view of a high-frequency module of a third example corresponding to a plane along line Y-Y of FIG. 1A.

Third Example with Reference to FIG. 4

In a high-frequency module 1C of a third example, as shown in FIG. 4, fluidization preventing via-hole conductors 17c and 17d are connected by lands 35a provided on a resin sheet, and fluidization preventing via-hole conductors 17e to 17g are connected by lands 35b provided on the resin sheet. In the third example, other features are the same as in the first example, and achieve the same effects as in the first example. The fluidization preventing via-hole conductors 17c to 17g are divided into groups of two or three, and each group is connected to its common land 35a or 35b, so that the via-hole conductors 17c to 17g are reinforced, whereby the internal memory IC chip 25 can be protected more effectively. The lands 35a and 35b are formed to a thickness of from 5 μm to 35 μm, so as to cover the fluidization preventing via-hole conductors 17, and therefore, achieve the effects of adding support to the via-hole conductors 17 and preventing the resin in the resin sheets from flowing into the cavity 20.

Figure 5:
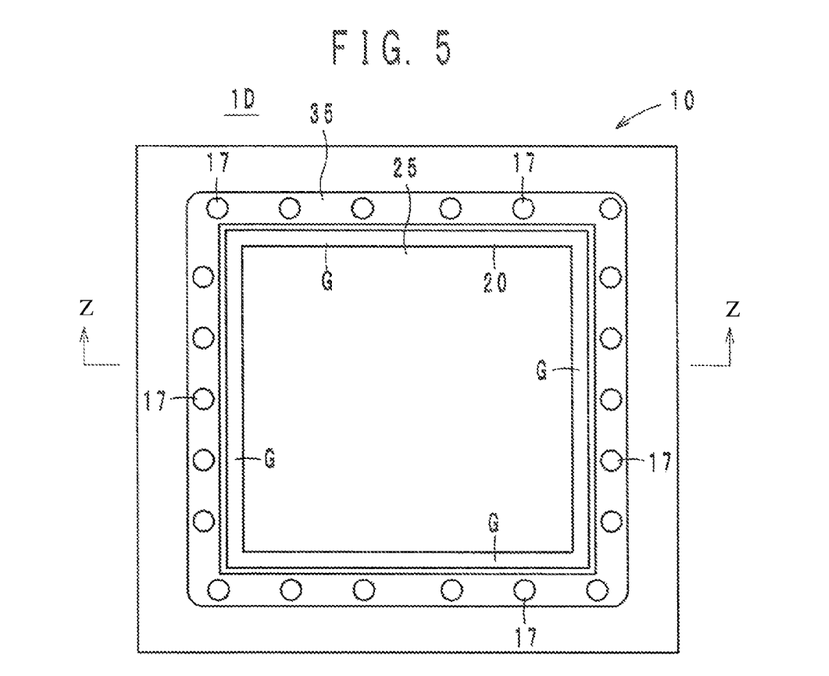
FIG. 5 is a plan view of a high-frequency module of a fourth example corresponding to a plane along line Y-Y of FIG. 1A.
Figure 6:
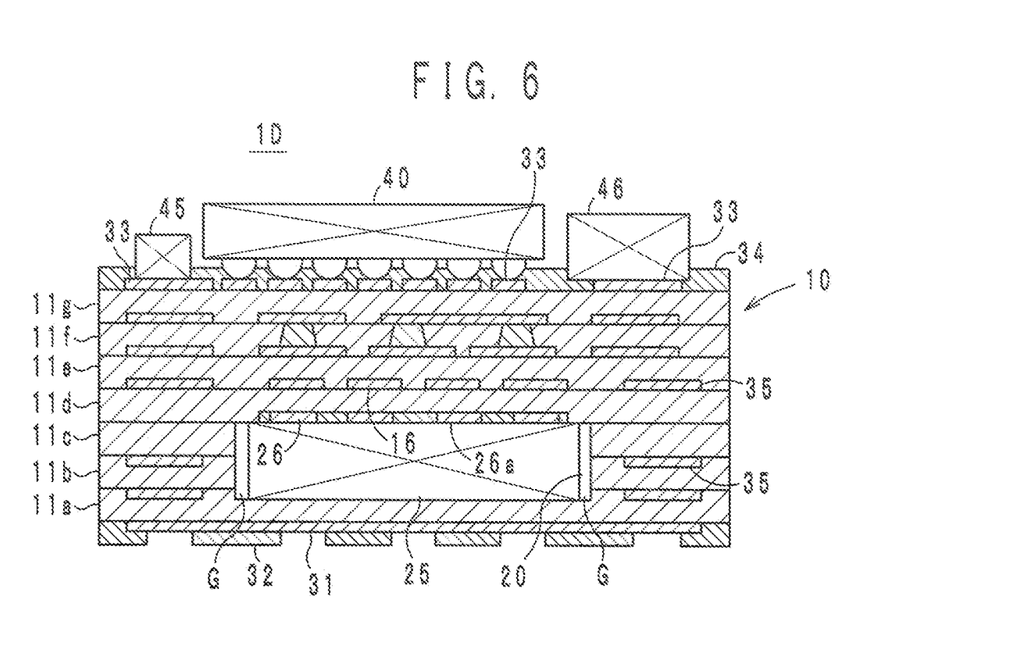
FIG. 6 is a vertical cross-sectional view of the high-frequency module of the fourth example along line Z-Z of FIG. 5.

Fourth Example with Reference to FIGS. 5 and 6

In a high-frequency module 1D of a fourth example, the fluidization preventing via-hole conductors 17 are connected by a single land 35 provided in a square loop-like form on a resin sheet, as shown in FIG. 5. In the fourth example, other features are the same as in the first example, and achieve the same effects as in the first example. In the fourth example, in particular, all of the fluidization preventing via-hole conductors 17 are connected by their common land 35, and therefore, the internal memory IC chip 25 can be protected more effectively. Moreover, as can be appreciated from FIG. 6, the square loop-like land 35 makes it possible to prevent the resin in the resin sheets both inside and outside the area where the land 35 is positioned from being softened and flowing into the cavity 20, not only in the cross-sectional portions including the fluidization preventing via-hole conductors 17 but also in the cross-sectional portions not including the fluidization preventing via-hole conductors 17.

Other Examples

Note that the high-frequency module of the present invention is not limited by the above examples, and various modifications can be made within the spirit and scope of the invention.

In particular, the type of electronic components to be surface-mounted on or provided in the multilayer board can be selected arbitrarily, and the shape of conductor patterns to be provided in the multilayer board as well as the circuit configuration provided by such conductor patterns can also be selected arbitrarily.

Although the present invention has been described in connection with the preferred embodiment above, it is to be noted that various changes and modifications are possible to those who are skilled in the art. Such changes and modifications are to be understood as being within the scope of the invention.

What is claimed is:

1. A high-frequency module comprising:
    a multilayer board formed by laminating a plurality of sheets made of a thermoplastic resin material and subjecting the laminated sheets to thermocompression bonding; and
    an IC chip placed in a cavity provided in the multilayer board,
    wherein a gap is provided between a side of the IC chip and an inner wall of the cavity,
    the multilayer board includes a via-hole conductor provided near the inner wall of the cavity for preventing the resin sheets from being softened and flowing into the cavity upon thermocompression bonding, and
    the via-hole conductor is electrically insulated.

2. The high-frequency module according to claim 1, wherein a surface-mount IC chip is provided on a top surface of the multilayer board.

3. The high-frequency module according to claim 1, wherein the multilayer board has internal passive elements.

4. The high-frequency module according to claim 1, wherein the via-hole conductor is made of a material solidifiable at a lower temperature than a temperature at which the resin sheets are softened and fluidized.

5. The high-frequency module according to claim 1, wherein the via-hole conductor is made of solder or a metal alloy mainly composed of silver or copper.

6. The high-frequency module according to claim 1 further comprising a plurality of additional via-hole conductors, wherein the via-hole conductors are arranged in a line surrounding the periphery of the cavity.

7. The high-frequency module according to claim 1 further comprising a plurality of additional via-hole conductors, wherein the via-hole conductors are arranged in a zigzag manner when viewed in a direction of lamination of the multilayer board.

8. The high-frequency module according to claim 1 further comprising a plurality of additional via-hole conductors, wherein the cavity is in the form of a rectangle when viewed in a direction of lamination of the multilayer board, and the via-hole conductors are positioned at least around one corner of the rectangle.

9. The high-frequency module according to claim 2, wherein the multilayer board has internal passive elements.

10. The high-frequency module according to claim 2, wherein the via-hole conductor is made of a material solidifiable at a lower temperature than a temperature at which the resin sheets are softened and fluidized.

11. The high-frequency module according to claim 3, wherein the via-hole conductor is made of a material solidifiable at a lower temperature than a temperature at which the resin sheets are softened and fluidized.

12. The high-frequency module according to claim 2, wherein the via-hole conductor is made of solder or a metal alloy mainly composed of silver or copper.

13. The high-frequency module according to claim 3, wherein the via-hole conductor is made of solder or a metal alloy mainly composed of silver or copper.

14. The high-frequency module according to claim 4, wherein the via-hole conductor is made of solder or a metal alloy mainly composed of silver or copper.

* * * * *

UNITED STATES PATENT AND TRADEMARK OFFICE
CERTIFICATE OF CORRECTION

PATENT NO. : 9,013,882 B2
APPLICATION NO. : 14/328989
DATED : April 21, 2015
INVENTOR(S) : Naoki Gouchi and Takahiro Baba It is certified that error appears in the above-identified patent and that said Letters Patent is hereby corrected as shown below:

In the specification,

Column 3, line 20, please add --20-- between "the cavity" and "upon thermocompression".

Signed and Sealed this
Eighth Day of September, 2015

Michelle K. Lee
*Director of the United States Patent and Trademark Office*